United States Patent
Chowdhury et al.

(10) Patent No.: US 12,368,095 B2
(45) Date of Patent: Jul. 22, 2025

(54) SIMULTANEOUS FILLING OF VARIABLE ASPECT RATIO SINGLE DAMASCENE CONTACT TO GATE AND TRENCH VIAS WITH LOW RESISTANCE BARRIERLESS SELECTIVE METALLIZATION

(71) Applicant: Intel Corporation, Santa Clara, CA (US)

(72) Inventors: AKM Shaestagir Chowdhury, Portland, OR (US); Debashish Basu, Beaverton, OR (US); Githin F. Alapatt, Portland, OR (US); Justin E. Mueller, Portland, OR (US); James Y. Jeong, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 789 days.

(21) Appl. No.: 17/485,299

(22) Filed: Sep. 24, 2021

(65) Prior Publication Data

US 2023/0101107 A1    Mar. 30, 2023

(51) Int. Cl.
*H01L 23/522*    (2006.01)
*H01L 21/768*    (2006.01)
*H01L 23/532*    (2006.01)

(52) U.S. Cl.
CPC .... *H01L 23/5226* (2013.01); *H01L 21/76879* (2013.01); *H01L 21/76895* (2013.01); *H01L 23/53252* (2013.01)

(58) Field of Classification Search
CPC .......... H01L 23/5226; H01L 23/53252; H01L 21/76879; H01L 21/76895
USPC ....................................................... 257/751
See application file for complete search history.

(56) References Cited

U.S. PATENT DOCUMENTS

| | | |
|---|---|---|
| 5,258,329 A | 11/1993 | Shibata |
| 5,763,321 A | 6/1998 | Ohshima |
| 2016/0218082 A1* | 7/2016 | Lee .......... H01L 24/20 |
| 2017/0287842 A1 | 10/2017 | Fu |
| 2020/0235246 A1* | 7/2020 | Sharma ............... H01L 29/0669 |
| 2021/0166969 A1* | 6/2021 | Cheng .................. H01L 29/785 |

OTHER PUBLICATIONS

Search Report from European Patent Application No. 22197314.2, mailed Feb. 12, 2023, 8 pgs.

* cited by examiner

*Primary Examiner* — Tu-Tu V Ho
(74) *Attorney, Agent, or Firm* — Schwabe, Williamson & Wyatt, P.C.

(57) ABSTRACT

An integrated circuit structure comprises a first metal layer having first conductive features. A second metal layer has second conductive features. A via layer is in an insulating layer between the first metal layer and the second metal layer. First vias and second vias are formed in the insulating layer. The first vias have a first aspect ratio greater than a second aspect ratio of the second vias. A barrier-less metal partially fills the first vias and fills the second vias. A pure metal fills a remainder of the first vias.

16 Claims, 7 Drawing Sheets

SIMULTANEOUS FILLING OF VARIABLE ASPECT RATIO SINGLE DAMASCENE CONTACT TO GATE AND TRENCH VIAS WITH LOW RESISTANCE BARRIERLESS SELECTIVE METALLIZATION

TECHNICAL FIELD

Embodiments of the disclosure are in the field of integrated circuit structures and, in particular, simultaneous filling of variable aspect ratio single damascene contact to gate and trench vias with low resistance barrier-less selective metallization.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive forever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

DESCRIPTION OF THE EMBODIMENTS

Figure 1A:
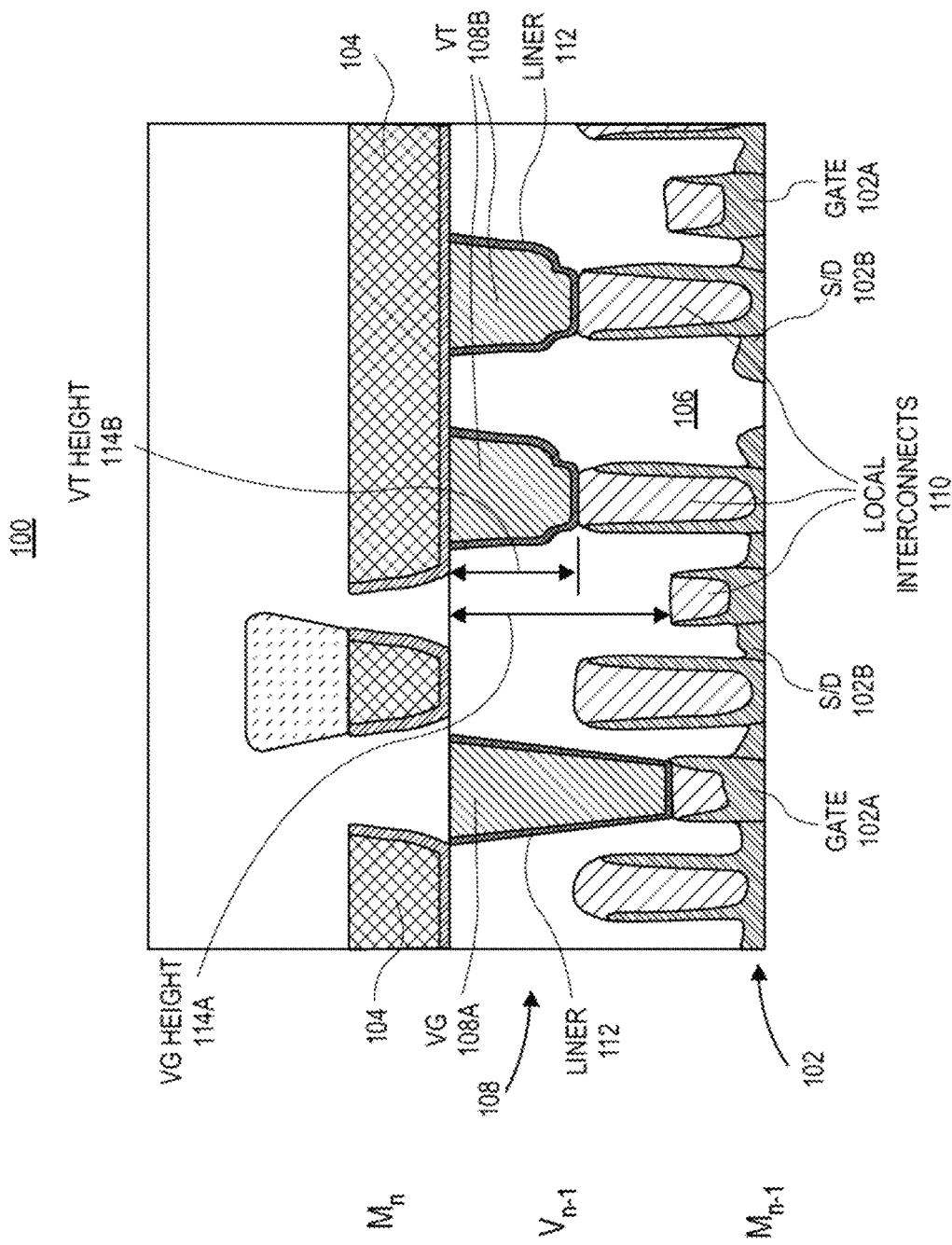
FIG. 1A illustrates a cross-section view of a portion of two metal layers of an integrated circuit (IC) with vias having variable height.

Simultaneous filling of variable aspect ratio single damascene contact to gate and trench vias with low resistance barrier-less selective metallization is described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the Figures are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back-end-of-line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to methods and architectures for simultaneous filling of variable aspect ratio single damascene contact to gate and trench vias with low resistance barrier-less selective metallization. According to the example embodiments, a hybrid gap-fill process simultaneously fills vias connecting metal layer Mn (e.g., M0) of an integrated circuit to a gate and vias connecting Mn to source/drain regions using low resistance barrier-less selective metallization. In embodiments, the barrier-less selective metallization combines selective metal fill and PVD/CVD deposition processes. For single damascene process for via patterning where both kinds of vias are filled at the same time, the hybrid gap-fill process is independent of aspect ratio and via critical dimension.

This solution provides a significant reduction in both gate via (VG) and source/drain via (VT) resistance on the order of 3× and 3.5×. One or more embodiments may be implemented to realize any high performance integrated circuit that requires reduced via resistance, such as a system on a chip (SoC) of future technology nodes.

To provide context, FIG. 1A illustrates a cross-section view of a portion of two metal layers of an integrated circuit (IC) with vias having variable height. The IC 100 comprises a first metal layer $M_{n-1}$ and a second metal layer $M_n$ with a via layer $(V_{n-1})$ in-between. In one embodiment, the first metal layer $M_{n-1}$ may comprise a device or transistor layer having conductive features 102, such as gates 102A and source/drain regions (S/D) 102B. The second metal layer may comprise $M_n$ such as M0, and have conductive features 104 such as interconnects. An insulating layer 106 is over the first metal layer $M_{n-1}$ in via layer $(V_{n-1})$. Vias 108 and local interconnects 110 are formed in the insulating layer 104. The vias 108 comprise gate vias (VGs) 108A and source/drain region vias (VTs) 108B. VGs 108A connect conductive features 104 in metal layer Mn to conductive features 102, such as gates 102A in $M_{n-1}$. VTs 108B connect to, or land on, the local interconnects 110 to connect the conductive features 104 in metal layer Mn to conductive features 102 such as S/D 102B in $M_{n-1}$. As shown, the VG height 114A typically spans a larger distance than the VT height 114B.

The VGs 108A and VTs 108B are formed using one of conductive feature forming techniques known to one of ordinary skill in the art of microelectronic device manufacturing. In one embodiment, the insulating layer 104 is patterned to form openings (e.g., trenches). In one embodiment, the openings in insulating layer 104 are formed using well-known patterning and etching techniques. A conductive material layer, e.g., a barrier or liner 112, is deposited along walls of the openings in the insulating layer 104, followed by a chemical vapor deposition (CVD) fill of another or the same conductive material, such as tungsten (W). Currently, the liner 112 in the vias 108 comprises tungsten nitride (WN) or tungsten carbon nitride (WCN) to provide adhesion between W and insulating layer 104 and is a flourine (F) barrier.

Use of the liner 112 and tungsten CVD are good for defects but unfortunately have a huge penalty for via resistance. In addition, the liner 112 consumes proportionally larger space inside the vias 108 as via size decreases, such as in the shorter VTs 108B, which further increases via resistance.

There is need therefore to eliminate the need for the liner 112 in order to reduce via resistance in ICs having variable height or aspect ratio vias 108. One proposed solution is to replace the liner 112 and CVD metal fill with a selective metal process using a pure low resistance metal, such as tungsten. However, a selective metal process is incapable of completely filling variable aspect ratio single damascene vias, and consequently will cause severe defects, as shown in FIG. 1B.

Figure 1B:
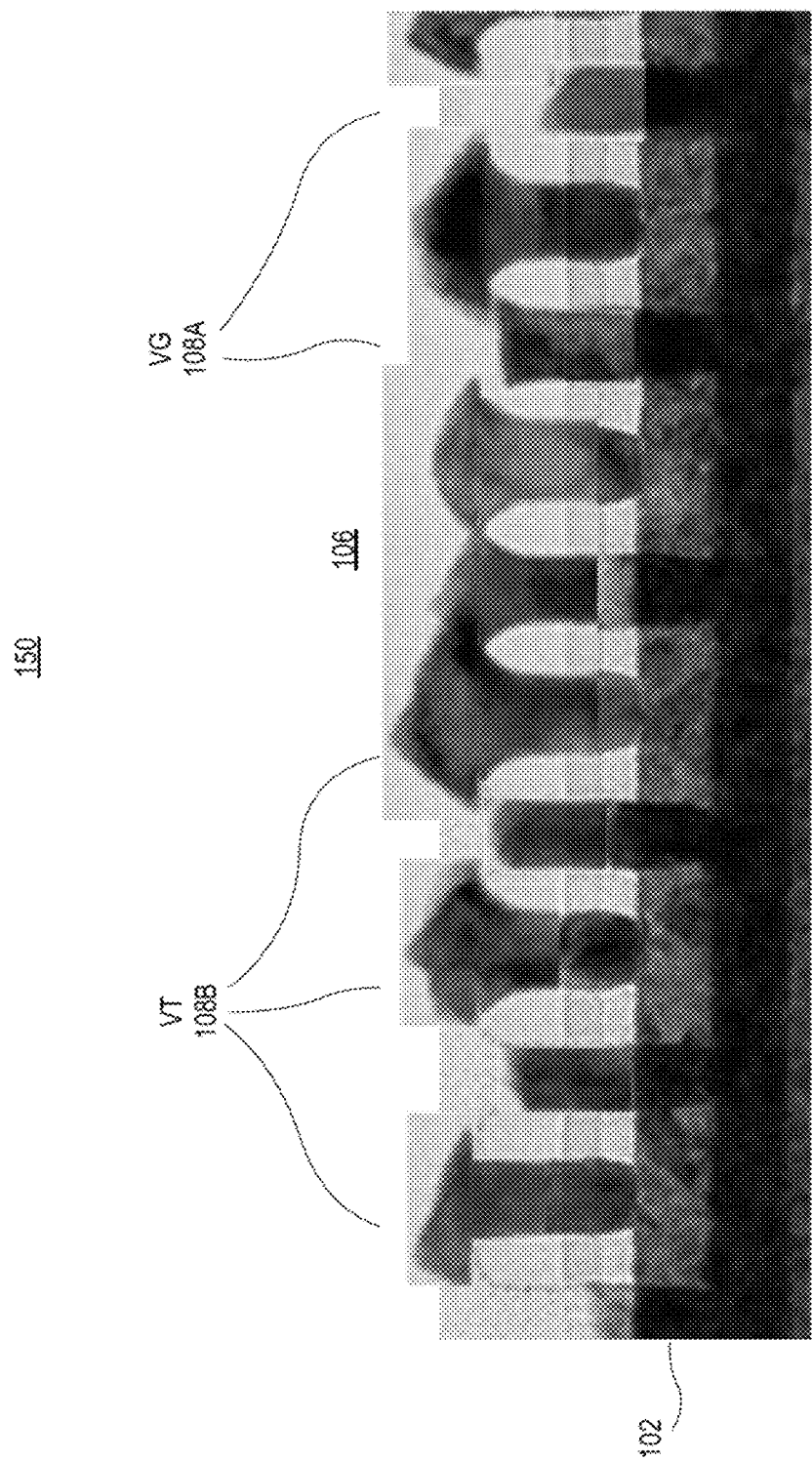
FIG. 1B illustrates a cross-section view showing a portion of two metal layers of an integrated circuit (IC) structure with vias having variable heights.

FIG. 1B illustrates a cross-section view showing a portion of two metal layers of an integrated circuit (IC) structure with vias having variable heights. Similar to FIG. 1A, the IC structure 150 includes insulating layer 106 and VGs 108A, VTs 108B, and conductive features 102. FIG. 1B shows that attempting to fill the variable aspect ratio vias 108A and 108B with a selective metal using single damascene process results in the longer VGs 108A being underfilled, while the shorter VTs 108B are overfilled as shown by mushroom-shaped tops. Chemical-mechanical polishing (CMP) techniques used to remove portions of a conductive material that extends above the top of the insulating layer 106 work on generally even surfaces and therefore cannot reach the selective metal in the underfilled VGs 108A. Consequently, a conventional single damascene with a selective metal cannot be used to fill the variable aspect ratio vias 108.

Figure 2:
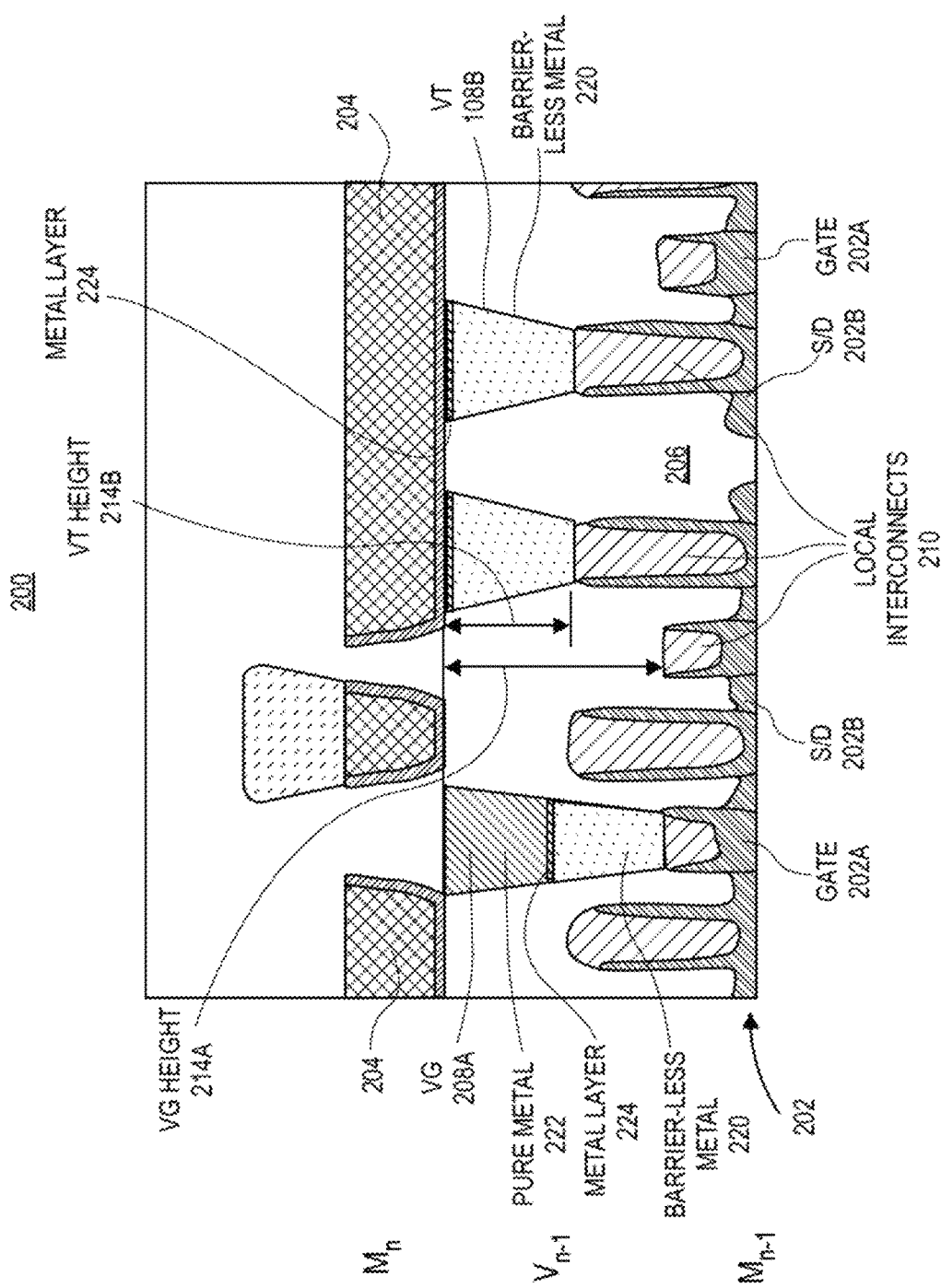
FIG. 2 illustrates a cross-section view of showing a portion of two metal layers of an integrated circuit (IC) structure with vias having variable height.

Referring now to FIG. 2, a departure from state of the art via filling techniques is shown according to the disclosed embodiments in which variable aspect ratio single damascene contact to gate and trench vias are filled with low resistance barrier-less selective metallization.

FIG. 2 illustrates a cross-section view of showing a portion of two metal layers of an integrated circuit (IC) structure with vias having variable height. The IC structure 200 comprises a first metal layer $M_{n-1}$ and a second metal layer $M_n$ with a via layer $(V_{n-1})$ in-between. In one embodiment, the first metal layer $M_{n-1}$ may comprise a device or transistor layer having conductive features 202, such as gates 202A and source/drain regions (S/D) 202B. The second metal layer may comprise $M_n$ such as M0, and have conductive feature 204 such as interconnects. An insulating layer 206 is over the first metal layer $M_{n-1}$ in via layer $(V_{n-1})$. Vias 208 comprising gate vias (VGs) 208A and vias (VTs) 208B, and local interconnects 210 are formed in the insulating layer 206.

As shown, the VG height 214A is larger than the VT height 214B, resulting in different aspect ratios, i.e., the aspect ratio for the VGs 208 is greater than the aspect ratio for the VTs 208B. VGs 208A connect conductive features 204 in metal layer Mn to conductive features 202, such as gates 202A in $M_{n-1}$. VTs 208B connect to, or land on, the local interconnects 210 to connect the conductive features 204 in metal layer Mn to conductive features 202, such as S/D 202B in $M_{n-1}$. Additional material layers may exist above or below the layers shown in FIG. 1A, and another same or different insulating layer as insulating layer 204 is over the conductive features 204.

According to the disclosed embodiments, low resistance barrier-less selective metallization is used to fill the vias 208, dispensing with the need for a liner 112. In particular, VT 208B and VG 208A are simultaneously filled with a barrier-less metal 220 until the VT 208B is filled with the barrier-less metal 220. Because the VG 208A is taller, this results in a bottom portion of the VG 208A being partially filled with the barrier-less metal 220. A remainder portion of the taller VG 208 is then filled with a pure metal 222. Prior to deposition of the pure metal 222, a thin metal layer 224 may be formed in VG 208A on the barrier-less metal 220 and on a top surface of the barrier-less metal 220 in VT 208B. In one embodiment, the metal layer 224 be approximately 5 to 20 nm in thickness.

In embodiments, the barrier-less metal 220 and the pure metal 222 are deposited using one of selective deposition techniques known to one of ordinary skill in the art of semiconductor manufacturing. Selective deposition refers to causing metal (e.g., tungsten) atoms to grow selectively from the bottom of the vias 208 to fill the vias 208 from the bottom up.

In embodiments, a barrier or liner-less metal deposition is used to substantially completely fill the VT 208B with a low resistance selective metal. In embodiment, barrier-less metal 220, the metal layer 224, and the pure metal 222 comprise a low resistance metal such as tungsten (W), but may also comprise, ruthenium (Ru), molybdenum (Mo), nickel (Ni), aluminum (Al), and the like, or any combination thereof such as Ni—Al.

In embodiments, the pure metal 222 is deposited using one of deposition techniques, such as but not limited to a chemical vapor deposition ("CVD"), a physical vapor deposition ("PVD"), or atomic layer deposition ("ALD").

Filling contact to gate and trench vias 208 with low resistance barrier-less selective metallization in accordance with the disclosed embodiments results is significant reduction in both the VG 208A and VT 208B via resistance on the order of 3× and 3.5×, respectively, from the current standard process in 7 nm production. This hybrid process can be tuned for simultaneously gap-filling different via heights ranging from 30 nm to 80 nm and is compatible with the TCN and gate metallization, which is tungsten.

In one embodiment, conductive feature 204 may be formed by an electroplating process that deposits a conductive metal layer, such as copper onto a seed layer. In another embodiment, the conductive layer is deposited onto the seed layer using one of selective deposition techniques known to one of ordinary skill in the art of semiconductor manufacturing, e.g., electroplating, electroless plating, or the like techniques. In one embodiment, the choice of a material for the conductive feature 204 determines the choice of a material for the seed layer, if any. For example, if the material for conductive feature 204 includes copper, the material for the seed layer also includes copper. In one embodiment, conductive layer includes e.g., copper (Cu), ruthenium (Ru), nickel (Ni), cobalt (Co), chromium (Cr), iron (Fe), manganese (Mn), titanium (Ti), aluminum (Al), hafnium (Hf), tantalum (Ta), tungsten (W), Vanadium (V), Molybdenum (Mo), palladium (Pd), gold (Au), silver (Au), platinum Pt, or any combination thereof.

In alternative embodiments, examples of the conductive materials that may be used for the conductive layer to form conductive features 204 include, but are not limited to, metals, e.g., copper, tantalum, tungsten, ruthenium, titanium, hafnium, zirconium, aluminum, silver, tin, lead, metal alloys, metal carbides, e.g., hafnium carbide, zirconium carbide, titanium carbide, tantalum carbide, aluminum carbide, other conductive materials, or any combination thereof.

In one embodiment, insulating layer 206 is an interlayer dielectric (ILD) layer. In one embodiment, insulating layer 206 is an oxide layer, e.g., a silicon oxide layer. In one embodiment, insulating layer 206 is a low-k dielectric, e.g., silicon dioxide, silicon oxide, carbon doped oxide ("CDO"), or any combination thereof. In one embodiment, insulating layer 206 includes a nitride, oxide, a polymer, phosphosilicate glass, fluorosilicate ("SiOF") glass, organosilicate glass ("SiOCH"), or any combination thereof. In another embodiment, insulating layer 214 is a nitride layer, e.g., silicon nitride layer. In alternative embodiments, insulating layer 214 is an aluminum oxide, silicon oxide nitride, other oxide/nitride layer, any combination thereof, or other electrically insulating layer determined by an electronic device design.

In one embodiment, the thickness of the insulating layer 206 is determined by design. In one embodiment, the insulating layer 206 is deposited to the thickness from about 50 nanometers (nm) to about 2 microns (μm). In an embodiment, insulating layer 206 is deposited using one of deposition techniques, such as but not limited to a chemical vapor deposition ("CVD"), e.g., a plasma enhanced chemical vapor deposition ("PECVD"), a physical vapor deposition ("PVD"), molecular beam epitaxy ("MBE"), metalorganic chemical vapor deposition ("MOCVD"), atomic layer deposition ("ALD"), spin-on, or other deposition techniques known to one of ordinary skill in the art of microelectronic device manufacturing.

In one embodiment, conductive features 210 in metal layer $M_{n-1}$ and lower are also formed in insulating layers. For example, metal layer $M_n$ may represent metal layer M4. However, in one embodiment, metal layer $M_n$ may be the lowest metal layer. In any case, the lowest metal layer of an integrated circuit may be formed over a substrate (not shown).

In an embodiment, the substrate comprises a semiconductor material, e.g., silicon (Si). In one embodiment, substrate is a monocrystalline Si substrate. In another embodiment, substrate is a polycrystalline silicon substrate. In another embodiment, substrate represents a previous interconnect layer. In yet another embodiment, substrate is an amorphous silicon substrate. In alternative embodiments, substrate includes silicon, germanium ("Ge"), silicon germanium ("SiGe"), a III-V materials based material e.g., gallium arsenide ("GaAs"), or any combination thereof. In one embodiment, the substrate includes metallization interconnect layers for integrated circuits. In at least some embodiments, the substrate includes electronic devices, e.g., transistors, memories, capacitors, resistors, optoelectronic devices, switches, and any other active and passive electronic devices that are separated by an electrically insulating layer, for example, an interlayer dielectric, a trench insulation layer, or any other insulating layer known to one of ordinary skill in the art of the electronic device manufacturing. In at least some embodiments, the substrate includes interconnects, for example, vias, configured to connect the metallization layers.

In an embodiment, substrate is a semiconductor-on-isolator (SOI) substrate including a bulk lower substrate, a middle insulation layer, and a top monocrystalline layer. The top monocrystalline layer may comprise any material listed above, e.g., silicon.

In various implementations, the substrate can be, e.g., an organic, a ceramic, a glass, or a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present invention.

The following is a process for filling variable aspect ratio single damascene contact to gate and trench vias with low resistance barrier-less selective metallization according to the disclosed embodiments. Incoming to the process is an IC structure comprising a metal layer over a substrate and a via layer over the metal layer. The metal layer may include conductive features embedded in a first insulating layer, and the via layer includes at least one gate via (VG) having a first aspect ratio and at least one source/drain via (VT) having a second aspect ratio less than the first aspect ratio.

The process may begin by performing a noble metal oxide pre-clean on bottoms of both the first set of vias and the second set of vias. Next, a barrier or liner-less metal deposition is performed simultaneously on VG and VT to deposit a barrier-less metal, such as selective W, Ru or Mo until the VT vias are filled, resulting a partial fill of the VG. In embodiments, the barrier-less metal may comprise selective W.

Figure 3A:
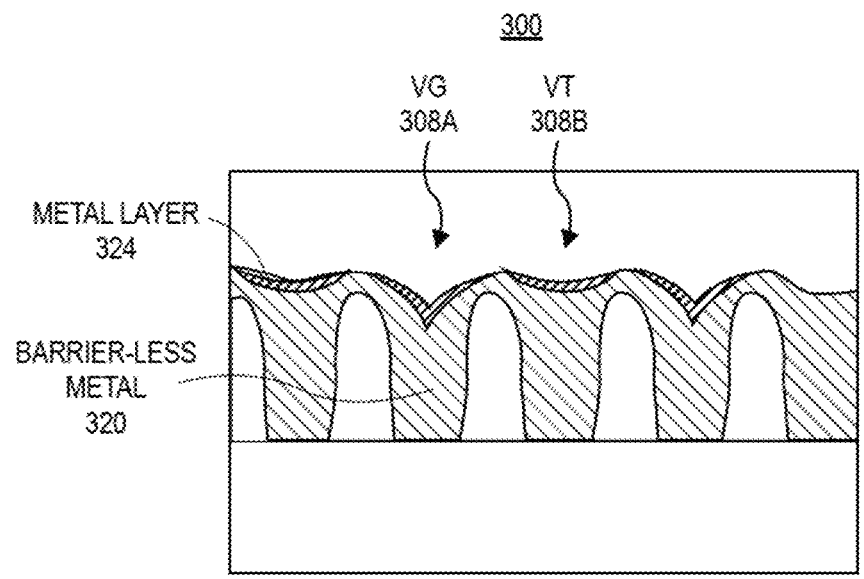
FIG. 3A illustrates a cross-sectional view of a portion of a via layer of an integrated circuit (IC) structure showing VG and VT.

After the barrier-less metal deposition, a second PVD, ALD or CVD metal deposition is performed simultaneously on VG and VT using a second metal, such as W, Ru or Mo, to form a metal layer that covers a top portion of the VT, and covers the barrier-less metal in the unfilled VG, as shown in FIG. 3A.

FIG. 3A illustrates a cross-sectional view of a portion of a via layer of an integrated circuit (IC) structure 300 showing VG 308A and VT 308B. The VT 308B is filled with the barrier-less metal 320 and the VG 308A is partially filled with the barrier-less metal 320 shown as a "U" shape. A thin metal layer 324 is on the top surface of the barrier-metal 320 in both VG 308A and VT 308B. In embodiments, the metal layer 324 may comprise a PVD W layer.

After the second PVD, ALD or CVD to form the thin metal layer, a third ALD or CVD metal deposition is performed to fill the remainder of the VG 308A with a third metal, such as W, Ru or Mo. In an embodiment, this step also deposits an over burden for polish. The third metal is a pure metal, meaning there is no contamination with other materials such as fluorine, chlorine and the like.

Figure 3B:
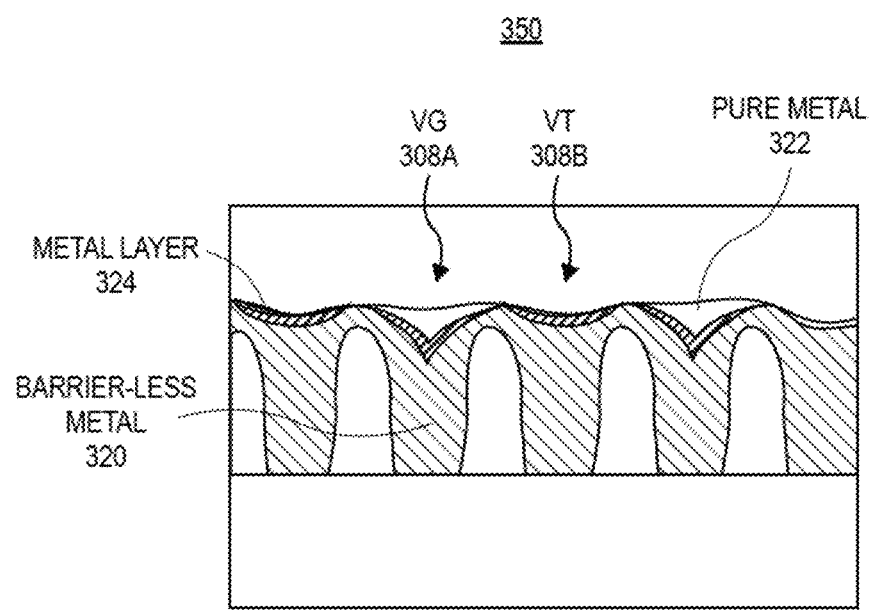
FIG. 3B illustrates a cross-sectional view of the portion of the via layer of integrated circuit (IC) structure showing VG and VT after a pure metal is deposited to fill the remainder of the of VG.

FIG. 3B illustrates a cross-sectional view of the portion of the via layer of integrated circuit (IC) structure 350 showing VG 308A and VT 308B after the pure metal 322 is deposited to fill the remainder of the of VG 308A. In embodiments, the third metal may comprise CVD W. Thus, the completed structure in one embodiment comprises the VT 308B is completely filled with selective W with a PVD W layer on top. The VG 308A is partially filled with selective W with the PVD W layer over the selective W, and CVD W filling the remainder.

The integrated circuit structures described herein may be included in an electronic device. As an example of one such apparatus, FIGS. 4A and 4B are top views of a wafer and dies that include one or more variable aspect ratio single damascene contact to gate and trench vias with low resistance barrier-less selective metallization, in accordance with one or more of the embodiments disclosed herein.

Figure 4B:
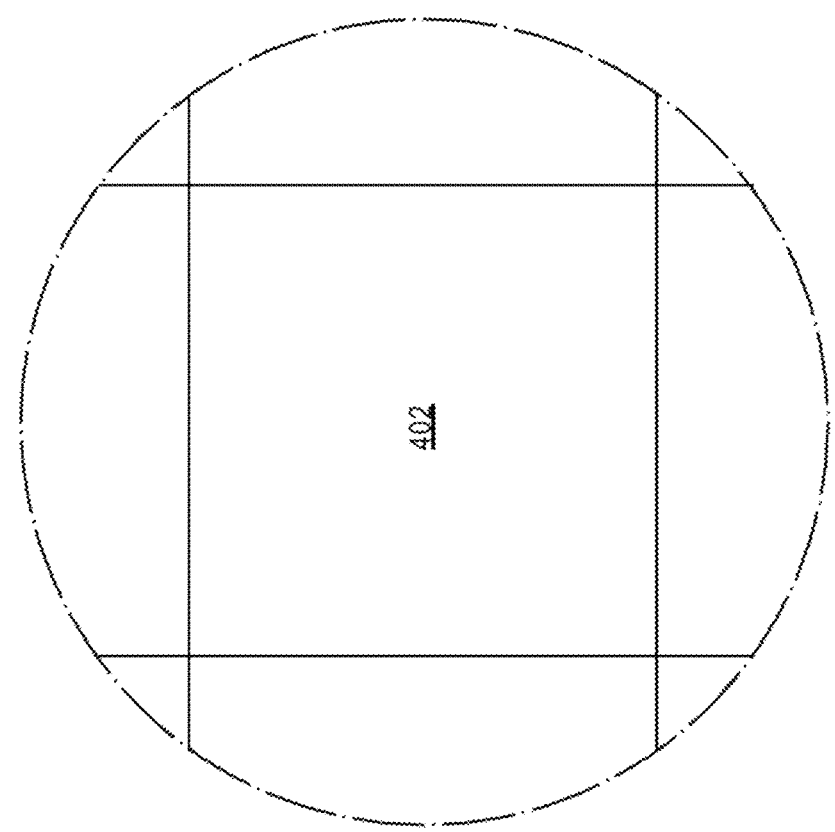
FIGS. 4A and 4B are top views of a wafer and dies that include one or more variable aspect ratio single damascene contact to gate and trench vias with low resistance barrier-less selective metallization, in accordance with one or more of the embodiments disclosed herein.
Figure 4A:
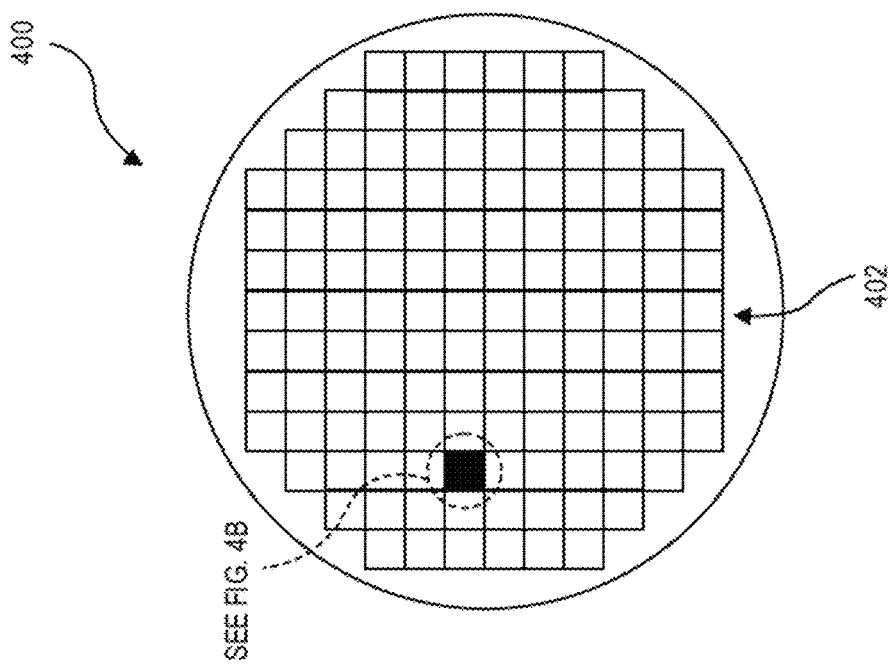

Referring to FIGS. 4A and 4B, a wafer 400 may be composed of semiconductor material and may include one or more dies 402 having integrated circuit (IC) structures formed on a surface of the wafer 400. Each of the dies 402 may be a repeating unit of a semiconductor product that includes any suitable IC (e.g., ICs including one or more variable aspect ratio single damascene contact to gate and trench vias with low resistance barrier-less selective metallization, such as described above. After the fabrication of the semiconductor product is complete, the wafer 400 may undergo a singulation process in which each of the dies 402 is separated from one another to provide discrete "chips" of the semiconductor product. In particular, structures that include embedded non-volatile memory structures having an independently scaled selector as disclosed herein may take the form of the wafer 400 (e.g., not singulated) or the form of the die 402 (e.g., singulated). The die 402 may include one or more embedded non-volatile memory structures based independently scaled selectors and/or supporting circuitry to route electrical signals, as well as any other IC components. In some embodiments, the wafer 400 or the die 402 may include an additional memory device (e.g., a static random access memory (SRAM) device), a logic device (e.g., an AND, OR, NAND, or NOR gate), or any other suitable circuit element. Multiple ones of these devices may be combined on a single die 402. For example, a memory array formed by multiple memory devices may be formed on a same die 402 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 5:
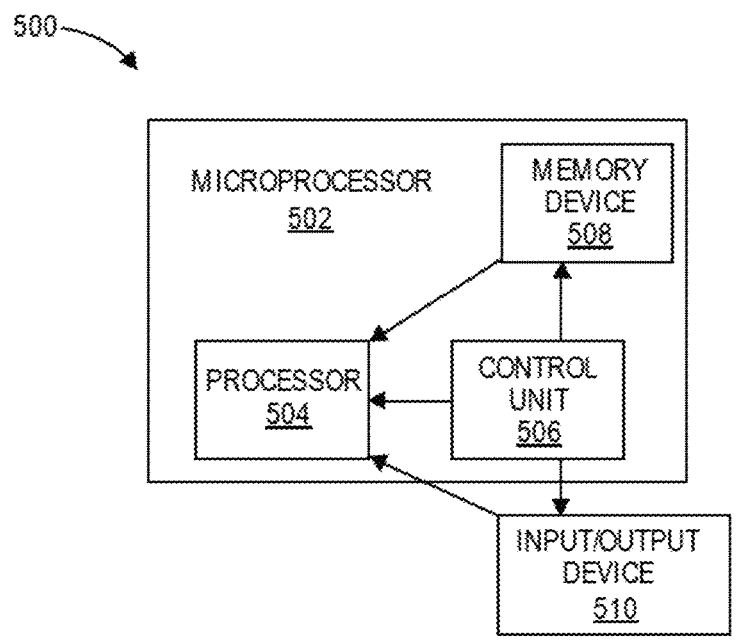
FIG. 5 illustrates a block diagram of an electronic system, in accordance with an embodiment of the present disclosure.

FIG. 5 illustrates a block diagram of an electronic system 500, in accordance with an embodiment of the present disclosure. The electronic system 500 can correspond to, for example, a portable system, a computer system, a process control system, or any other system that utilizes a processor and an associated memory. The electronic system 500 may include a microprocessor 502 (having a processor 504 and control unit 506), a memory device 508, and an input/output device 510 (it is to be appreciated that the electronic system 500 may have a plurality of processors, control units, memory device units and/or input/output devices in various embodiments). In one embodiment, the electronic system 500 has a set of instructions that define operations which are to be performed on data by the processor 504, as well as, other transactions between the processor 504, the memory device 508, and the input/output device 510. The control unit 506 coordinates the operations of the processor 504, the memory device 508 and the input/output device 510 by cycling through a set of operations that cause instructions to be retrieved from the memory device 508 and executed. The memory device 508 can include a non-volatile memory cell as described in the present description. In an embodiment, the memory device 508 is embedded in the microprocessor 502, as depicted in FIG. 5. In an embodiment, the processor 504, or another component of electronic system 500, includes one or more variable aspect ratio single damascene contact to gate and trench vias with low resistance barrier-less selective metallization, such as those described herein.

Figure 6:
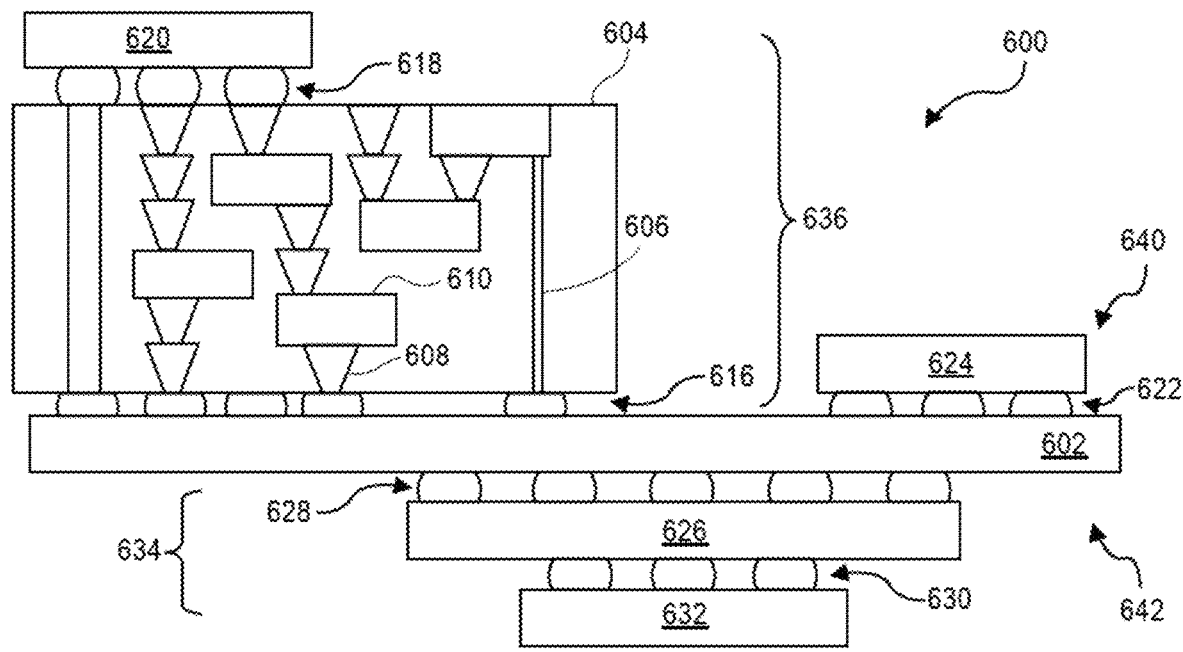
FIG. 6 is a cross-sectional side view of an integrated circuit (IC) device assembly that may include one or more variable aspect ratio single damascene contact to gate and trench vias with low resistance barrier-less selective metallization, in accordance with one or more of the embodiments disclosed herein.

FIG. 6 is a cross-sectional side view of an integrated circuit (IC) device assembly that may include one or more variable aspect ratio single damascene contact to gate and trench vias with low resistance barrier-less selective metallization, in accordance with one or more of the embodiments disclosed herein.

Referring to FIG. 6, an IC device assembly 600 includes components having one or more integrated circuit structures described herein. The IC device assembly 600 includes a number of components disposed on a circuit board 602 (which may be, e.g., a motherboard). The IC device assembly 600 includes components disposed on a first face 640 of the circuit board 602 and an opposing second face 642 of the circuit board 602. Generally, components may be disposed on one or both faces 640 and 642. In particular, any suitable ones of the components of the IC device assembly 600 may include a number of variable aspect ratio single damascene contact to gate and trench vias with low resistance barrier-less selective metallization, such as disclosed herein.

In some embodiments, the circuit board 602 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 602. In other embodiments, the circuit board 602 may be a non-PCB substrate.

The IC device assembly 600 illustrated in FIG. 6 includes a package-on-interposer structure 636 coupled to the first face 640 of the circuit board 602 by coupling components 616. The coupling components 616 may electrically and mechanically couple the package-on-interposer structure 636 to the circuit board 602, and may include solder balls (as shown in FIG. 6), male and female portions of a socket, an adhesive, an underfill material, and/or any other suitable electrical and/or mechanical coupling structure.

The package-on-interposer structure 636 may include an IC package 620 coupled to an interposer 604 by coupling components 618. The coupling components 618 may take any suitable form for the application, such as the forms discussed above with reference to the coupling components 616. Although a single IC package 620 is shown in FIG. 6, multiple IC packages may be coupled to the interposer 604. It is to be appreciated that additional interposers may be coupled to the interposer 604. The interposer 604 may provide an intervening substrate used to bridge the circuit board 602 and the IC package 620. The IC package 620 may be or include, for example, a die (the die 402 of FIG. 4B), or any other suitable component. Generally, the interposer 604 may spread a connection to a wider pitch or reroute a connection to a different connection. For example, the interposer 604 may couple the IC package 620 (e.g., a die) to a ball grid array (BGA) of the coupling components 616 for coupling to the circuit board 602. In the embodiment illustrated in FIG. 6, the IC package 620 and the circuit board 602 are attached to opposing sides of the interposer 604. In other embodiments, the IC package 620 and the circuit board 602 may be attached to a same side of the interposer 604. In some embodiments, three or more components may be interconnected by way of the interposer 604.

The interposer 604 may be formed of an epoxy resin, a fiberglass-reinforced epoxy resin, a ceramic material, or a polymer material such as polyimide. In some implementations, the interposer 604 may be formed of alternate rigid or flexible materials that may include the same materials described above for use in a semiconductor substrate, such as silicon, germanium, and other group III-V and group IV materials. The interposer 604 may include metal interconnects 610 and vias 608, including but not limited to through-silicon vias (TSVs) 606. The interposer 604 may further include embedded devices, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 604. The package-on-interposer structure 636 may take the form of any of the package-on-interposer structures known in the art.

The IC device assembly 600 may include an IC package 624 coupled to the first face 640 of the circuit board 602 by coupling components 622. The coupling components 622 may take the form of any of the embodiments discussed above with reference to the coupling components 616, and the IC package 624 may take the form of any of the embodiments discussed above with reference to the IC package 620.

The IC device assembly 600 illustrated in FIG. 6 includes a package-on-package structure 634 coupled to the second face 642 of the circuit board 602 by coupling components 628. The package-on-package structure 634 may include an IC package 626 and an IC package 632 coupled together by coupling components 630 such that the IC package 626 is disposed between the circuit board 602 and the IC package 632. The coupling components 628 and 630 may take the form of any of the embodiments of the coupling components 616 discussed above, and the IC packages 626 and 632 may take the form of any of the embodiments of the IC package 620 discussed above. The package-on-package structure 634 may be configured in accordance with any of the package-on-package structures known in the art.

Figure 7:
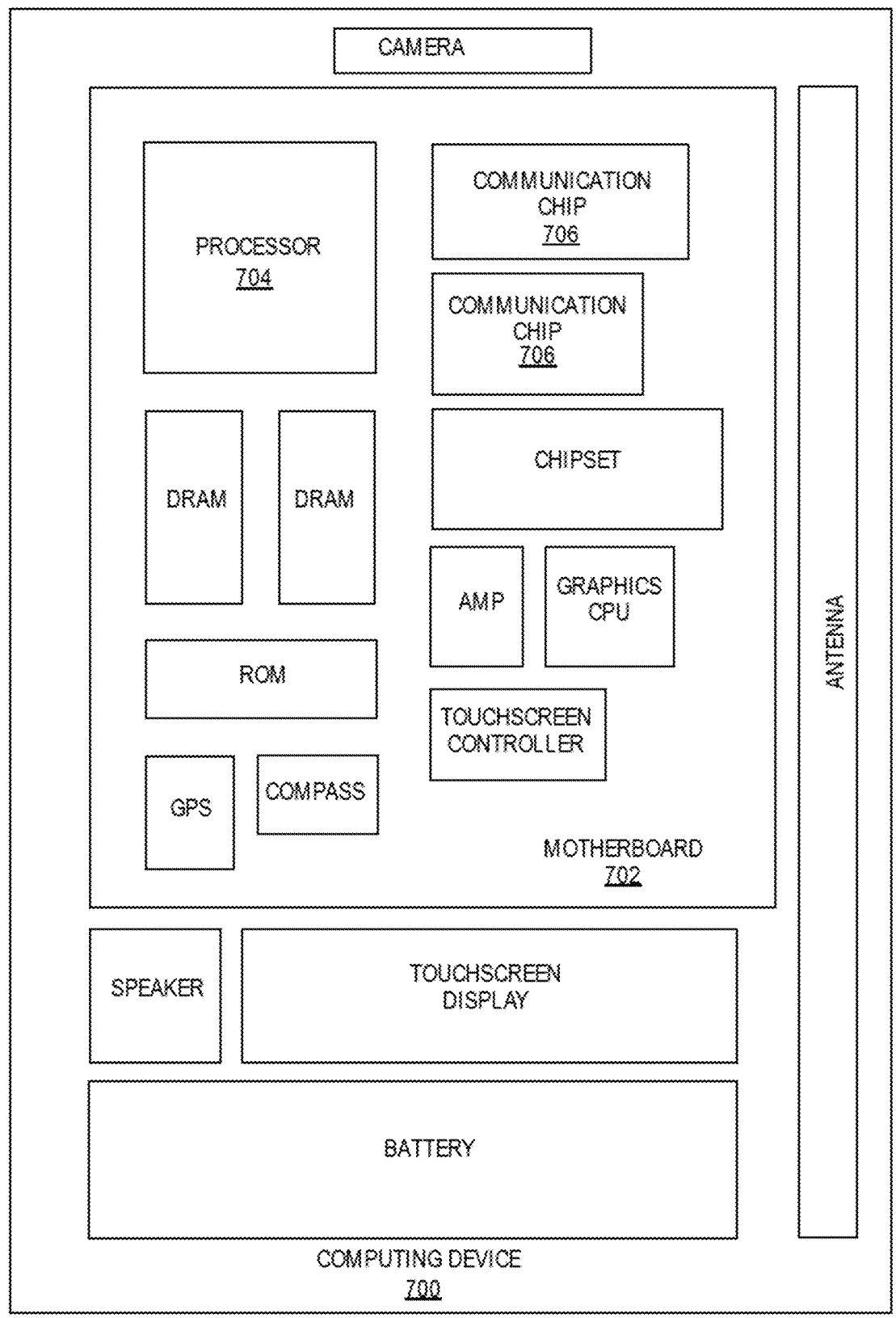
FIG. 7 illustrates a computing device in accordance with one implementation of the disclosure.

FIG. 7 illustrates a computing device 700 in accordance with one implementation of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the disclosure, the integrated circuit die of the processor includes one or more variable aspect ratio single damascene contact to gate and trench vias with low resistance barrier-less selective metallization, in accordance with implementations of embodiments of the disclosure. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of embodiments of the disclosure, the integrated circuit die of the communication chip includes one or more variable aspect ratio single damascene contact to gate and trench vias with low resistance barrier-less selective metallization, in accordance with implementations of embodiments of the disclosure.

In further implementations, another component housed within the computing device 700 may contain an integrated circuit die that includes one or more variable aspect ratio single damascene contact to gate and trench vias with low resistance barrier-less selective metallization, in accordance with implementations of embodiments of the disclosure.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Thus, embodiments described herein include variable aspect ratio single damascene contact to gate and trench vias with low resistance barrier-less selective metallization.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure comprises a first metal layer having first conductive features. A second metal layer has second conductive features. A via layer is in an insulating layer between the first metal layer and the second metal layer. First vias and second vias are formed in the insulating layer. The first vias have a first aspect ratio greater than a second aspect ratio of the second vias. A barrier-less metal partially fills the first vias and fills the second vias. A pure metal fills a remainder of the first vias.

Example embodiment 2: The integrated circuit structure of example embodiment 1 wherein the barrier-less metal comprises a low resistance selective metal.

Example embodiment 3: The integrated circuit structure of example embodiment 1 or 2, further comprising a metal layer formed in the first vias between the barrier-less metal and the pure metal, the metal layer further formed in the second vias on a top surface of the barrier-less metal.

Example embodiment 4: The integrated circuit structure of example embodiment 1, 2, or 3 wherein the low resistance selective metal, the metal layer, and the pure metal comprises tungsten (W), ruthenium (Ru), molybdenum (Mo), nickel (Ni), aluminum (Al), or a combination thereof.

Example embodiment 5: The integrated circuit structure of example embodiment 1, 2, 3, or 4, wherein the pure metal is deposited using a chemical vapor deposition, a physical vapor deposition, or atomic layer deposition.

Example embodiment 6: The integrated circuit structure of example embodiment 1, 2, 3, 4 or 5, wherein heights of the first vias and the second vias range from 30 nm to 80 nm.

Example embodiment 7: The integrated circuit structure of example embodiment 1, 2, 3, 4, 5, or 6 wherein the first metal layer comprises a device layer and the first conductive features comprise gates and source/drain regions.

Example embodiment 8: The integrated circuit structure of example embodiment 7, wherein second conductive features in the second metal layer comprise interconnects.

Example embodiment 9: The integrated circuit structure of example embodiment 8, wherein the first vias connect the gates in the device layer to the interconnects in the second metal layer, and the second vias connect the source/drain regions to the interconnects and the second metal layer.

Example embodiment 10: the integrated circuit structure of example environment 9, further comprising local interconnects in the via layer connected between the first vias and the gates and between the second vias and the source/drain regions.

Example embodiment 11: a method of fabricating an integrated circuit comprises receiving the integrate circuit pre-formed with first vias and second vias formed in a first insulating layer over a first metal layer, the first vias having a height greater than the second vias. The first vias and the second vias are simultaneously filled with a barrier-less metal until the second vias are filled with the barrier-less metal and the first vias are partially filled with the barrier-less metal. A remainder of the first vias are filled with a pure metal.

Example embodiment 12: The method of example embodiment 11, further comprising: prior to filling the remainder of the first vias with the pure metal, forming a metal layer in the first vias and on a top surface of the barrier-less metal in the second vias.

Example embodiment 13: The method of example embodiment 11 or 12, further comprising: depositing the barrier-less metal and the pure metal using selective deposition.

Example embodiment 14: The method of example embodiment 11, 12 or 13, further comprising: forming the barrier-less metal and the pure metal with tungsten (W), ruthenium (Ru), molybdenum (Mo), nickel (Ni), aluminum (Al), or a combination thereof.

Example embodiment 15: The method of example embodiment 11, 12, 13, or 14, further comprising: depositing the pure metal using a chemical vapor deposition, a physical vapor deposition, or atomic layer deposition.

Example embodiment 16: The method of example embodiment 11, 12, 13, 14, or 15, further comprising: forming a second metal layer with interconnects formed in a second insulating layer over the via layer, wherein the first vias and the second vias connect first conductive features in the first metal layer to second conductive features in the second metal layer.

Example embodiment 17: A computing device comprises a board and a component coupled to the board. The component includes an integrated circuit structure, comprising a first metal layer having first conductive features. A second metal layer has second conductive features. A via layer is in an insulating layer between the first metal layer and the second metal layer. First vias and second vias are formed in the insulating layer. The first vias have a first aspect ratio greater than a second aspect ratio of the second vias. A barrier-less metal partially fills the first vias and fills the second vias. A pure metal fills a remainder of the first vias.

Example embodiment 18: The computing device of example embodiment 17, further comprising a memory coupled to the board.

Example embodiment 19: The computing device of example embodiment 17 or 18, further comprising a communication chip coupled to the board.

Example embodiment 20: The computing device of example embodiment 17, 18 or 19, further comprising a battery coupled to the board.

What is claimed is:

1. An integrated circuit structure, comprising:
   a first metal layer comprising a device layer having first conductive features including gates and source/drain regions;
   a second metal layer having second conductive features including interconnects;
   a via layer in an insulating layer between the first metal layer and the second metal layer;
   first vias and second vias formed in the insulating layer, the first vias having a first aspect ratio greater than a second aspect ratio of the second vias, wherein the first vias connect the gates in the device layer to the interconnects in the second metal layer, and the second vias connect the source/drain regions to the interconnects and the second metal layer;
   a barrier-less metal partially filling the first vias and filling the second vias; and
   a pure metal filling a remainder of the first vias.

2. The integrated circuit structure of claim 1, wherein the barrier-less metal comprises a low resistance selective metal.

3. The integrated circuit structure of claim 2, further comprising a metal layer formed in the first vias between the barrier-less metal and the pure metal, the metal layer further formed in the second via on a top surface of the barrier-less metal.

4. The integrated circuit structure of claim 3, wherein the low resistance selective metal, the metal layer, and the pure metal comprises tungsten (W), ruthenium (Ru), molybdenum (Mo), nickel (Ni), aluminum (Al), or a combination thereof.

5. The integrated circuit structure of claim 1, wherein the pure metal is deposited using a chemical vapor deposition, a physical vapor deposition, or atomic layer deposition.

6. The integrated circuit structure of claim 1, wherein heights of the first vias and the second vias range from 30 nm to 80 nm.

7. The integrated circuit structure of claim 1, further comprising local interconnects in the via layer connected between the first vias and the gates and between the second vias and the source/drain regions.

8. A method of fabricating an integrated circuit, the method comprising:
   receiving the integrated circuit pre-formed with first vias and second vias formed in a first insulating layer over a first metal layer, the first vias having a height greater than the second vias, the first metal layer including gates and source/drain regions, wherein the first vias connect the gates to a second metal layer, and the second vias connect the source/drain regions to the second metal layer;
   simultaneously filling the first vias and the second vias with a barrier-less metal until the second vias are filled with the barrier-less metal and the first vias are partially filled with the barrier-less metal; and
   filling a remainder of the first vias with a pure metal.

9. The method of claim 8, further comprising: prior to filling the remainder of the first vias with the pure metal, forming the second metal layer one the first vias and on a top surface of the barrier-less metal in the second vias.

10. The method of claim 8, further comprising: depositing the barrier-less metal and the pure metal using selective deposition.

11. The method of claim 8, further comprising: forming the barrier-less metal and the pure metal with tungsten (W), ruthenium (Ru), molybdenum (Mo), nickel (Ni), aluminum (Al), or a combination thereof.

12. The method of claim 8, further comprising: depositing the pure metal using a chemical vapor deposition, a physical vapor deposition, or atomic layer deposition.

13. A computing device, comprising:
   a board; and
   a component coupled to the board, the component including an integrated circuit structure, comprising:

a first metal layer comprising a device layer having first conductive features including gates and source/drain regions;

a second metal layer having second conductive features including interconnects;

a via layer in insulating layer between the first metal layer and the second metal layer;

first vias and second vias formed in the insulating layer, the first vias having a first aspect ratio greater than a second aspect ratio of the second vias, wherein the first vias connect the gates in the device layer to the interconnects in the second metal layer, and the second vias connect the source/drain regions to the interconnects and the second metal layer;

a barrier-less metal partially filling the first vias and filling the second vias; and a pure metal filling a remainder of the first vias.

14. The computing device of claim 13, further comprising:

a memory coupled to the board.

15. The computing device of claim 13, further comprising:

a communication chip coupled to the board.

16. The computing device of claim 13, further comprising:

a battery coupled to the board.

\* \* \* \* \*